(12) United States Patent
Shimizu

(10) Patent No.: US 7,154,132 B2
(45) Date of Patent: Dec. 26, 2006

(54) SEMICONDUCTOR DEVICE WITH DUMMY ELECTRODE

(75) Inventor: Satoshi Shimizu, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/716,614

(22) Filed: Nov. 20, 2003

(65) Prior Publication Data

US 2004/0232444 A1     Nov. 25, 2004

(30) Foreign Application Priority Data

May 21, 2003 (JP) ............................ 2003-143761

(51) Int. Cl.
*H01L 29/76* (2006.01)

(52) U.S. Cl. ............... 257/202; 257/316; 257/317; 257/319; 257/320; 257/321; 257/201; 257/257

(58) Field of Classification Search ........... 257/202, 257/412, 707, 212, 203, 205, 207, 204, 344, 257/345, 413
See application file for complete search history.

(56) References Cited

U.S. PATENT DOCUMENTS

| 5,698,902 | A  | * | 12/1997 | Uehara et al. ............... 257/773 |
| 6,080,624 | A  |   | 6/2000  | Kamiya et al. |
| 6,265,292 | B1 |   | 7/2001  | Parat et al. |
| 6,667,199 | B1 | * | 12/2003 | Torii et al. .................. 438/183 |
| 6,753,574 | B1 | * | 6/2004  | Yamaguchi et al. ......... 257/331 |
| 6,815,759 | B1 | * | 11/2004 | Horiguchi et al. .......... 257/316 |
| 2003/0013253 | A1 | | 1/2003 | Hurley |
| 2003/0042520 | A1 | * | 3/2003 | Tsukamoto et al. ......... 257/296 |

FOREIGN PATENT DOCUMENTS

| JP | 08-236767 | 9/1996 |
| JP | P2000-77535 A | 3/2000 |
| JP | P2000-114481 A | 4/2000 |
| JP | P2002-26156 A | 1/2002 |
| JP | 2003-046079 | 2/2003 |

OTHER PUBLICATIONS

"NAND Flash Memory", F. Masuoka, Flash Memory Business Symposium, Jun. 16, 1993, pp. 1-11.
"DINOR Flash Memory", Y. Terada, Flash Memory Business Symposium, Jun. 16, 1993, pp. 1-7.
"NOR Flash Memory", T. Okasawa, Flash Memory Business Symposium, Jun. 16, 1993, pp. 1-6.

* cited by examiner

*Primary Examiner*—Nathan J. Flynn
*Assistant Examiner*—Fazli Erdem
(74) *Attorney, Agent, or Firm*—McDermott Will & Emery LLP

(57) ABSTRACT

A semiconductor device includes a gate electrode having a straight portion, a dummy electrode located at a point on the extension of the straight portion, a stopper insulating film, a sidewall insulating film, an interlayer insulating film, and a linear contact portion extending, when viewed from above, parallel to the straight portion. The longer side of the rectangle defined by the linear contact portion is, when viewed from above, located beyond the sidewall insulating film and within the top region of the gate electrode and the dummy electrode. A gap G between the gate electrode and the dummy electrode appearing, when viewed from above, in the linear contact portion is filled with the sidewall insulating film such that the semiconductor substrate is not exposed.

12 Claims, 8 Drawing Sheets

SEMICONDUCTOR DEVICE WITH DUMMY ELECTRODE

BACKGROUND OF THE INVENTION

1. Field of the Invention

The present invention relates to a semiconductor device, and more particularly, a semiconductor device provided with a dummy electrode.

2. Description of the Background Art

In a flash memory NOR array of conventional art, a linear isolation insulating film and a linear active region are arranged parallel to each other on the surface of a substrate and extend in a first direction. Located on such a substrate, a linear gate electrode is disposed extending linearly in a second direction that is perpendicular to the first direction. There are a plurality of gate electrodes parallel to each other. When seen from above, a plurality of exposed regions of the surface of the substrate extending linearly and parallel to each other in gaps between the gate electrodes define source and drain regions, alternating with each other. In respective layers located above the gate electrodes, one of three types of metal interconnection is provided. The three types of interconnections are electrically connected to the gate electrode, the source region, and the drain region, respectively. Contact etching is generally known as a technique for connecting the source and drain regions with the corresponding metal interconnections.

As semiconductor devices are being continually downsized, the planar area of each section of the NOR array is required to be smaller. SAS (Self-Aligned Source) is known as a technique for facilitating the fabrication for a smaller width of the source region. SAS is disclosed in, for example, Japanese Patent Laying-Open No. 2002-26156.

In the SAS technique, the gate electrode is made before a resist is formed to cover the drain region and expose the source region. Then the resist and the gate electrode are used as a mask to etch away the portion of the isolation insulator that exist in the source region. Then, ion implantation is performed on each source region, thereby forming a diffused layer close to each source region of the surface of the substrate. Since the isolation insulator in the source region has already been removed, this diffused layer is continuous in the longitudinal direction of the source region. Thus, the diffused layer formed close to the source region of the surface of the substrate serves as a source interconnection that establishes electrical connection between the plurality of parallel active regions. Such a structure obtained by the SAS technique is called an "SAS structure".

For an SAS structure, a high concentration of ion implantation to the source region is required in order to provide sufficiently low resistance in the source interconnection. Meanwhile, the width of the gate electrode is being reduced due to a smaller size of the device. With a smaller width of the gate electrode, an SAS structure having a conventional diffused layer of high concentration suffered a lack of the ability to sufficiently restrain the punch-through phenomenon encountered below the gate electrode.

Self-Aligned Contact (SAC) is generally known as the technique to stop contact etching by means of the insulating film protecting the gate electrode. The interlayer insulating film is formed of a material differing from that of the insulating film protecting the gate electrode, and the difference in selectivity is used during contact etching.

In order to avoid the punch-through phenomenon encountered in the SAS structure, SAC is sometimes employed in spite of a smaller width of the source region for etching to form a round contact hole connecting to the source region. In such cases, a stopper insulating film and sidewall insulating film made of SiN and the like initially covering the top surface and side of the gate electrode may be partially etched away during the etching step, whereby the gate electrode will be exposed directly in the contact hole. When a contact portion is formed by filling the contact hole with a conductive material, a short circuit will occur between the gate electrode and the contact portion. In other words, the gate is short-circuited to the source.

SUMMARY OF THE INVENTION

An object of the present invention is to provide a semiconductor device with a structure that has a short circuit between the gate electrode and the contact portion prevented when the SAC technique is employed, and that has the punch-through phenomenon seen in SAS suppressed.

In order to achieve the object stated above, a semiconductor device according to the present invention includes a semiconductor substrate having a source and drain regions at its surface; a gate electrode formed on the semiconductor substrate, having a straight portion separating the source region and the drain region; a dummy electrode formed at a position on the extension of the longitudinal direction of the straight portion on the semiconductor substrate; a stopper insulating film that overlies each of the gate electrode and the dummy electrode; a sidewall insulating film covering the sidewall of the gate and dummy electrodes and the stopper insulating film; an interlayer insulating film covering the top surface of the semiconductor substrate to cover up the stopper insulating film and sidewall insulating film; and a linear contact portion that extends, when viewed from above, parallel to the straight portion of the gate electrode. The linear contact portion is a conductive member extending vertically in the interlayer insulating film and electrically connected to one of the source region and the drain region at its bottom end. It should be noted that the longer sides of the rectangle defined by the linear contact portion, when viewed from above, are located beyond the sidewall insulating film and within the top region of the gate and dummy electrodes. The gap between the dummy electrode and the gate electrode appearing in the linear contact portion, when viewed from above, is filled with the sidewall insulating film such that the semiconductor substrate is not exposed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
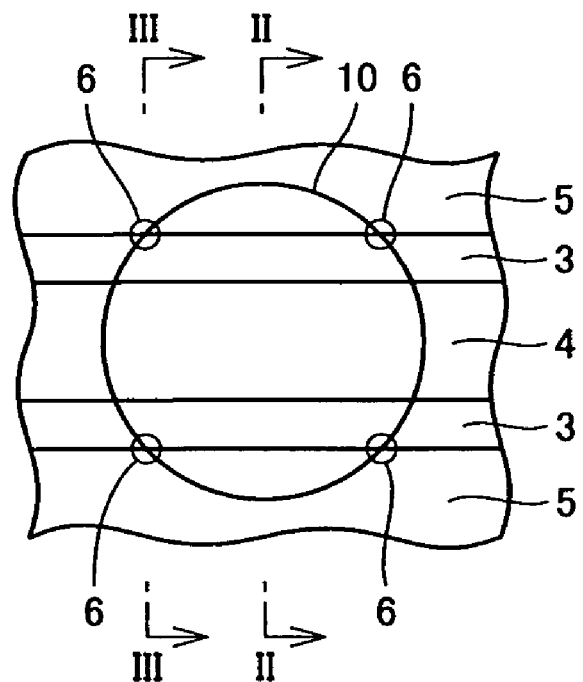
FIG. 1 illustrates a step of forming a contact hole, to which reference is made during the discussion of the present invention.
Figure 2:
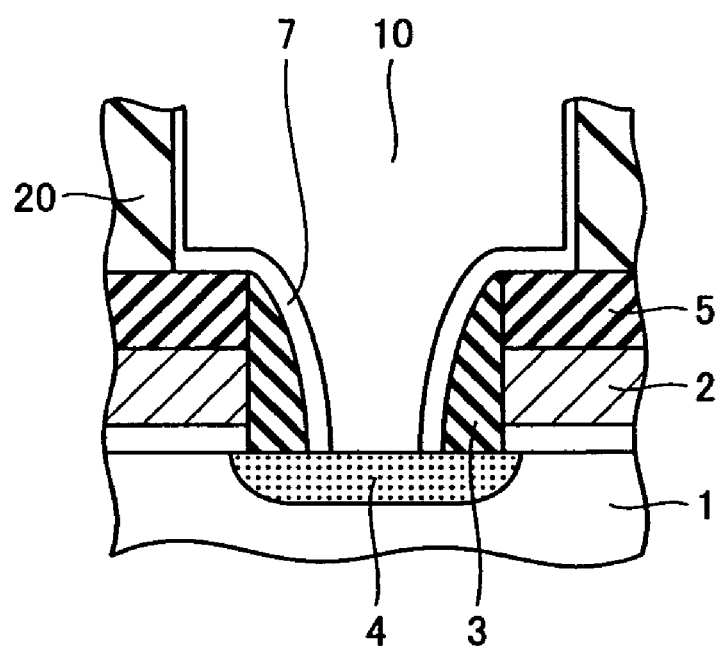
FIG. 2 is a cross sectional view of the contact hole in the direction of the arrow of II—II in FIG. 1.
Figure 3:
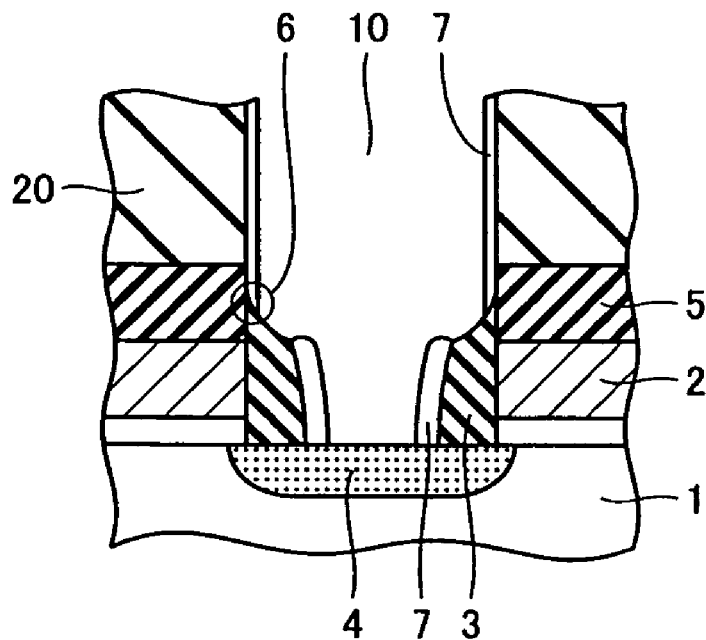
FIG. 3 is a cross sectional view of the contact hole in the direction of the arrow of III—III in FIG. 1.

The inventors have investigated to determine the mechanism of how a short circuit occurs between the gate electrode and the contact portion when employing the SAC technique. It has been identified that shorting of this kind tends to occur at a location where, when seen from above as in FIG. 1, the circumference of a contact hole 10 crosses the contour of a stopper insulating film 5 (hereinafter referred to as "contour-crossing point" 6). FIG. 1 shows a plan view where contact hole 10 is provided for a connection to a source region 4. FIG. 2 shows a cross section in the direction of the arrow of II—II in FIG. 1. FIG. 3 shows a cross section in the direction of the arrow of III—III in FIG. 1. A gate electrode 2 formed on semiconductor substrate 1, with a gate insulating film therebetween, has its top surface covered by a stopper insulating film 5 having the same width as that of gate electrode 2. The side of gate electrode 2 and stopper insulating film 5 is covered by a sidewall insulating film 3.

The SAC technique generally uses a mixture of three gases for anisotropic etching. The three gases include a so-called "deposition gas", a so-called "restraint gas" and a so-called a "dilution gas". The deposition gas is a multiple combination of carbon (C) atoms, such as $C_4F_8$, $C_5F_8$, $C_4F_6$. The deposition gas is used to form a film of reaction product, a so-called "deposited film", on the inner surface of a hole formed by etching. The deposited film serves to protect the object in the processing step from the removal action by etching. The restraint gas is used for restraining the effect of the deposition gas and promoting etching, and is implemented by, for example, oxygenic gases such as $O_2$ and CO. The dilution gas is used for diluting the deposition and restraint gases.

During anisotropic etching, deposition films are successively formed on the side of the hole as etching continues in order to suppress the progression of the removal action toward the side and, on the bottom of the hole, a downward removal continues since the removal action prevails over the formation of the deposition film. By maintaining this condition, selective etching that occurs downward is effected.

Figure 4:
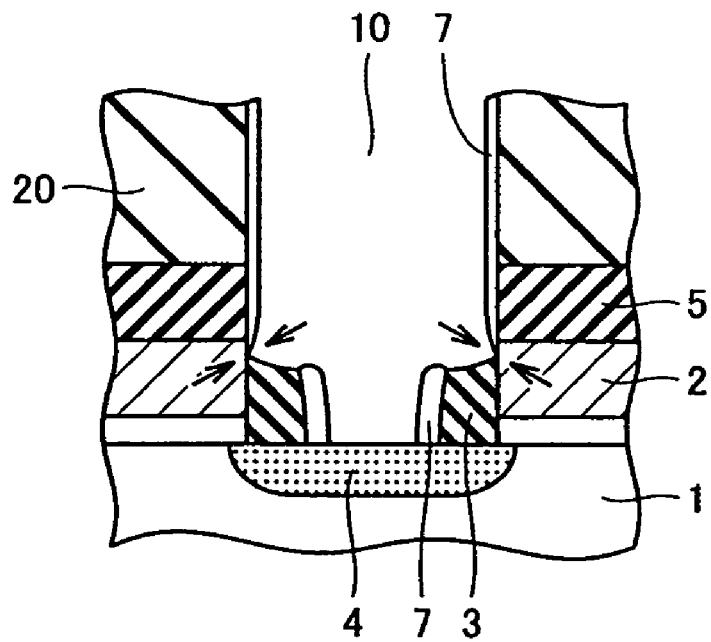
FIG. 4 shows a cross section similar to that of FIG. 3 after further etching.

Supposedly, a short circuit of the kind mentioned above tends to occur at contour crossing point 6 because contour crossing point 6 corresponds to a recess on the bottom of the hole, preventing the deposition gas to be sufficiently spread due to geometrical restrictions during anisotropic etching, such that the formation of deposited film 7 is not satisfactory. Along the section of II—II, deposited film 7 is thick enough even on the shoulder of the transistor structure to prevent a short as shown in FIG. 2. However, along the section III—III passing through contour crossing point 6, deposited film 7 is not sufficiently formed as shown in FIG. 3, causing sidewall insulating film 3 made of SiN and the like to be etched away. Thus, as shown in FIG. 4, undesired removal of sidewall insulating film 3 exposes gate electrode 2 that has been covered up within, causing a short.

Based on the findings as described above, the inventors have made improvements leading up to the present invention. Embodiments thereof will now be described.

First Embodiment

Figure 5:
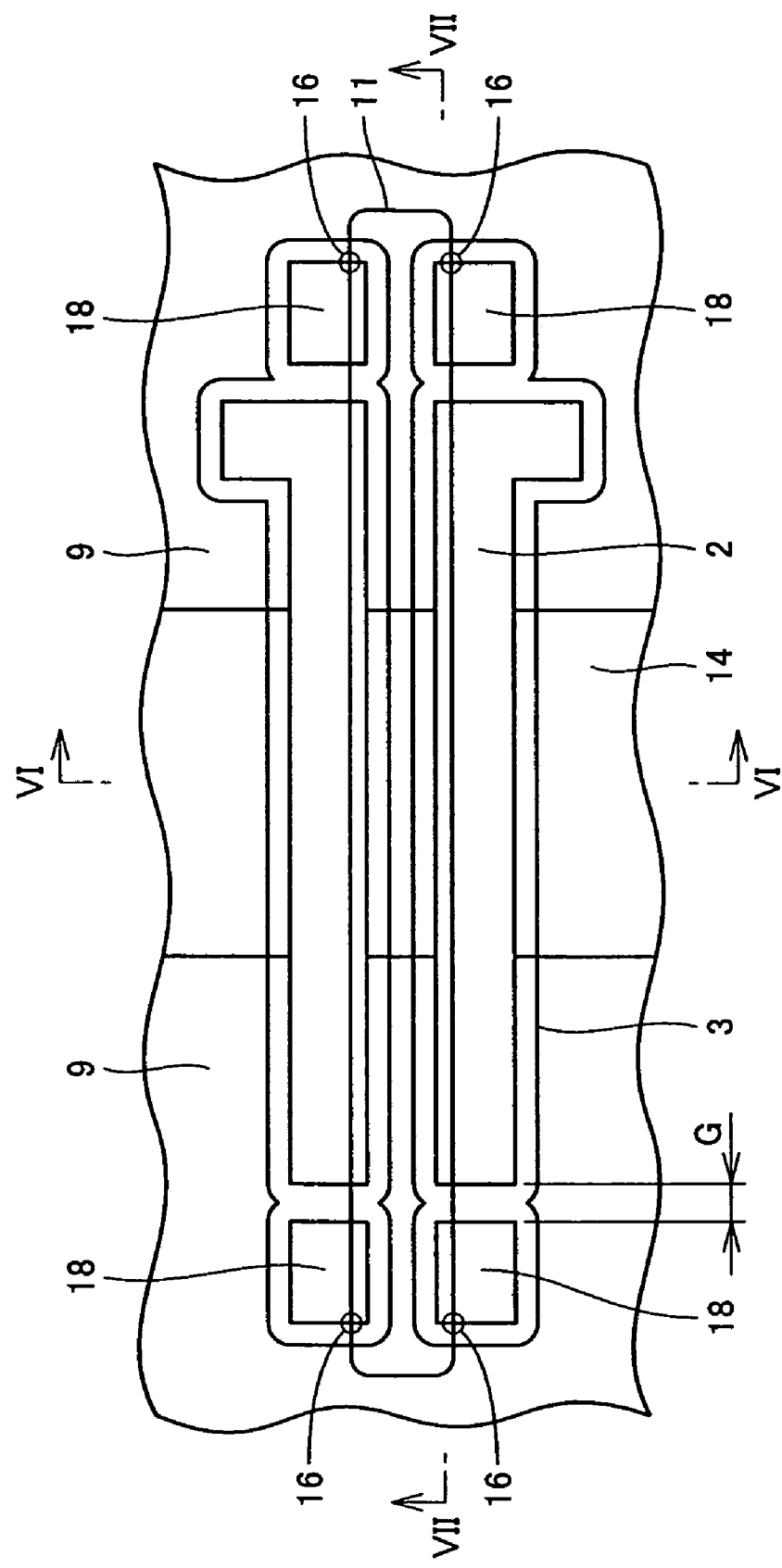
FIG. 5 is a plan view schematically showing a geometry of components of a semiconductor device according to a first embodiment of the present invention.
Figure 6:
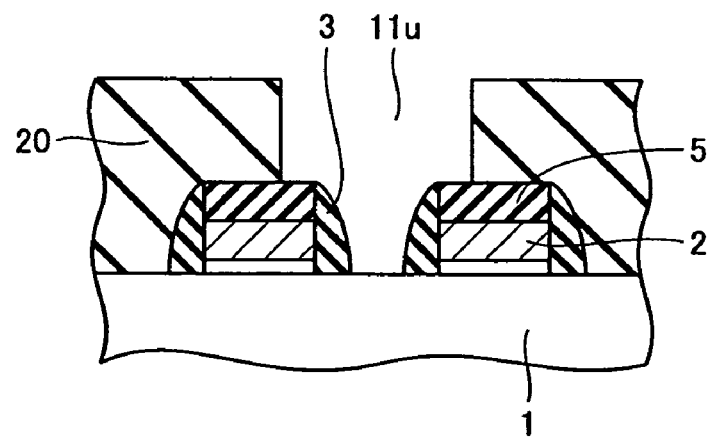
FIG. 6 is a cross sectional view of the semiconductor device in the direction of the arrow of VI—VI in FIG. 5.
Figure 7:
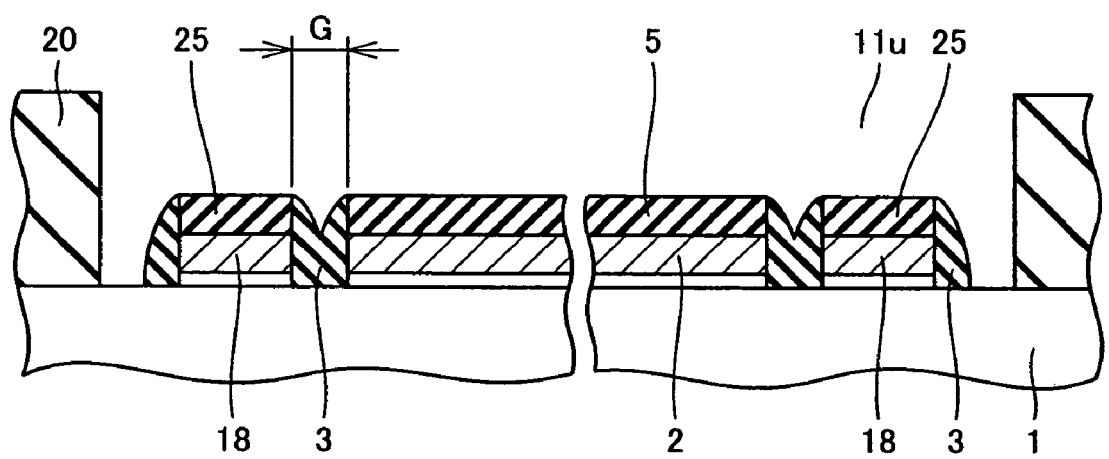
FIG. 7 is a cross sectional view of the semiconductor device in the direction of the arrow of VII—VII in FIG. 5.

Referring to FIGS. 5 to 7, a semiconductor device according to a first embodiment of the present invention is described. The present embodiment illustrates a relatively simple transistor structure to which the present invention is applied. FIG. 5 shows a plan view of a semiconductor device according to the present embodiment. FIG. 6 shows a cross section in the direction of the arrow of VI—VI in FIG. 5. FIG. 7 is a cross section in the direction of the arrow of VII—VII in FIG. 5. It should be noted, however, that the cross sections of FIGS. 6 and 7 do not precisely correspond to that of FIG. 5, and have some components omitted from or added to the view of FIG. 5 for convenience, as described below.

In the semiconductor device of the present embodiment, an isolation insulating film 9 partially covers the surface of semiconductor substrate 1, such that the entire device is divided into an active region 14 and a region of isolation insulating film 9, when seen from above. Active region 14 extends strip-like in the vertical direction of FIG. 5. At least two gate electrodes 2 are formed linearly on semiconductor substrate 1. Each of two gate electrodes 2 includes a straight portion that extends perpendicularly to the longitudinal direction of active region 14. Active region 14 is segmented by the straight portion of a gate electrode 2 into a source region on one side and a drain region on the other. Thus, in the example shown in FIG. 5, the portion of active region 14 between two gate electrodes 2 forms a source region, and the rest is a drain region.

As shown in FIGS. 6 and 7, a stopper insulating film 5 is formed on top of gate electrodes 2. Stopper insulating film 5 has the same size as gate electrodes 2 and covers the top surface of gate electrodes 2. The side of gate electrode 2 and stopper insulating film 5 is covered by a sidewall insulating film 3. It should be noted, however, that stopper insulating film 5 is omitted in FIG. 5 for convenience to make gate electrodes 2 visible from above.

A dummy electrode 18 is formed on semiconductor substrate 1 close to each end of the straight portion of each gate electrode 2, and at a position on the extension of the straight portion of each gate electrode 2. Dummy electrode 18 has its top surface covered by a stopper insulating film 25 that has the same size as dummy electrode 18. The side of dummy electrode 18 and stopper insulating film 25 is also covered by sidewall insulating film 3. It should be noted, again, that stopper insulating film 25 is omitted in FIG. 5 for convenience to make dummy electrode 18 visible from above.

As shown in FIGS. 6 and 7, the entire device is covered by an interlayer insulating film 20 except for a linear contact portion 11. Interlayer insulating film 20 is omitted in FIG. 5 for convenience. In FIGS. 6 and 7, a linear contact hole 11*u*, which is a recess to be filled with a conductive material for linear contact portion 11, is shown in a state prior to the filling with the conductive material.

Returning to FIG. 5, a linear contact portion 11 extends between two gate electrodes 2 and parallel to the straight portion of gate electrode 2. Linear contact portion 11 extends between two pairs of dummy electrodes 18 close to both ends of gate electrodes 2, as well, and terminates beyond dummy electrodes 18. Linear contact portion 11 is formed of a conductive material, and not only extends considerably in the direction parallel to the surface of semiconductor substrate 1, but also in the direction perpendicular to the surface of semiconductor substrate 1. In other words, linear contact portion 11 extends vertically (i.e. perpendicularly to the paper sheet plane of FIG. 5, and in the vertical direction of FIGS. 6 and 7), penetrating interlayer insulating film 20. The bottom end of linear contact portion 11 is connected to active region 14 between gate electrodes 2, i.e. connected to one of the source and drain regions. Further, when viewed from above, i.e. when considering the plan view of FIG. 5, each of the longer sides of the rectangle defined by linear contact portion 11 is located beyond sidewall insulating film 3 and within the top region of gate and dummy electrodes 2, 18.

As shown in FIGS. 5 and 7, gate electrode 2 and dummy electrodes 18 are sufficiently close to each other, such that sidewall insulating film 3 is continuous in the gap G between gate electrode 2 and dummy electrode 18. Particularly, the portion of gap G appearing in linear contact portion 11 is filled with sidewall insulating film 3 such that semiconductor substrate 1 is not exposed.

In order to fabricate a semiconductor device of the structure described above, a manufacturing method according to a conventional known technique can be used for etching to form gate electrode 2 and stopper insulating film 5 on gate electrodes 2, where a pattern providing for dummy electrodes 18 and stopper insulating film 25 on each dummy electrode 18 is added to the conventional etching pattern.

In the semiconductor device according to the present embodiment having the structure described above, the region where sidewall insulating film 3 will be easily removed during the etching step for forming linear contact hole 11u corresponds to contour crossing point 16 shown in FIG. 5 at which the contour of dummy electrodes 18 crosses the circumference of linear contact hole 11u, thus solving the problem of a short circuit caused by undesired removal of sidewall insulating film 3 for gate electrode 2 that is intended to function. Even if a short occurs between a dummy electrode 18 and linear contact portion 11 due to removal of sidewall insulating film 3 for dummy electrode 18, this does not present a problem because dummy electrode 18 has nothing to do with the function of the semiconductor device.

In this semiconductor device, an active region 14 between gate electrodes 2, i.e. one of the source and drain regions, has electrical connection via linear contact portion 11, ensuring a greater contact area with the relevant active region 14, resulting in lower contact resistance. Also, by employing a linear contact portion 11 extending considerably laterally as described above, the position of linear contact portion 11 to be connected from above for interconnection can be chosen more freely. Consequently, a metal interconnection located further above can be arranged more freely.

Second Embodiment

Figure 8:
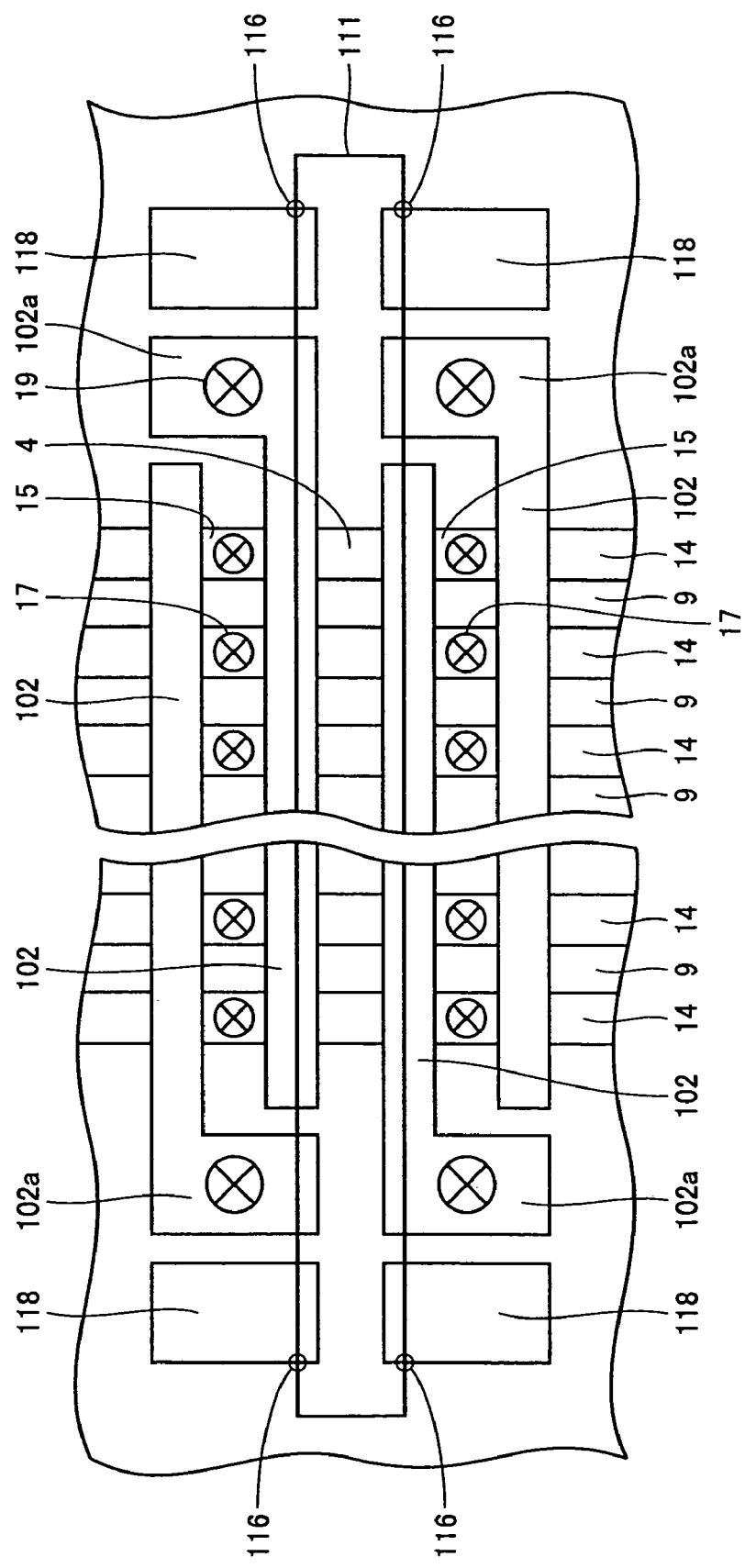
FIG. 8 is a plan view that schematically shows a geometry of components of a semiconductor device according to a second embodiment of the present invention.

Referring now to FIG. 8, a semiconductor device according to a second embodiment of the present invention will be described. The present embodiment illustrates a flash memory array to which the present invention is applied.

A semiconductor device according to the present embodiment is similar to that of the first embodiment in that the surface of a semiconductor substrate shown in FIG. 8 is divided into an active region 14 and a region of isolation insulating film 9, when seen from above. In the present embodiment, however, a plurality of parallel active regions 14 extend in the vertical direction of FIG. 8. Active regions 14 are separated from each other by isolation insulating films 9. A plurality of gate electrodes 102 each include a straight portion which extends perpendicularly to the longitudinal direction of active regions 14. Each active region 14 is segmented by the straight portion of each of gate electrodes 102 into a source region 4 on one side and a drain region 15 on the other. A stopper insulating film 5 is formed on top of each gate electrode 102. Stopper insulating film 5 has the same size as gate electrode 102 and covers the top surface of gate electrode 102. A side of gate electrode 102 and stopper insulating film 5 is covered by a sidewall insulating film 3. It should be noted, however, that stopper insulating film 5 and the sidewall insulating film are omitted in FIG. 8 in order to clarify the geometry of gate electrodes 102 and linear contact portion 111. One end of the straight portion of each gate electrode 102 has a wide portion 102a. A dummy electrode 118 is disposed further at the outer side. Wide portion 102a at an end of each gate electrode 102 is located close enough to dummy electrode 118. A linear contact portion 111 is disposed along gate electrodes 102 and dummy electrodes 118 and extends further beyond dummy electrodes 118. Each of the longer sides of the rectangle defined by linear contact portion 111 is positioned beyond sidewall insulating film and within the top region of gate electrode 102 and each dummy electrode 118.

A gate contact 19 is provided in each wide portion 102a at an end of gate electrodes 102. Gate contact 19 is provided for electrical connection with an interconnection for gate 102 distributed above (i.e. above the paper sheet plane of FIG. 8). A drain contact 17 is provided in each drain region 15. Drain contact 17 is provided for electrical connection with an interconnection for the drain that is again distributed above and separated from the interconnection for the gate. In FIG. 8, drain contacts 17 and gate contacts 19 are indicated by symbols "×" in the circles. Electrical connection to source region 4, which is located between two gate electrodes 102 that are centrally disposed, is established by linear contact portion 111.

There are a plurality of like source regions 4 and a plurality of like drain regions 15 that are discrete in the lateral direction of FIG. 8 in one line, with isolation insulating films 9 interposed therebetween. The set of the regions arranged in a line is referred to as a group of discrete regions.

Although, in the description above, attention is focused on only one group of discrete source regions 4 and linear contact portion 111 connected integrally thereto is explained, there may be, in practice, a plurality of groups of discrete source regions 4. In an array structure adapted to practical use, a plurality of gate electrodes 102 are disposed parallel to each other, and there are groups of discrete source regions 4 and groups of discrete drain regions 15 therebetween arranged alternately in the vertical direction of FIG. 8. In this case, one linear contact portion 111 is provided for each group of discrete source regions 4.

If a group of selected ones of discrete source or drain regions (i.e. source regions in the present embodiment) is referred to as a "group of regions of a specified type", each of a plurality of linear contact portions 111 covers one of a plurality of groups of regions of a specified type.

Figure 9:
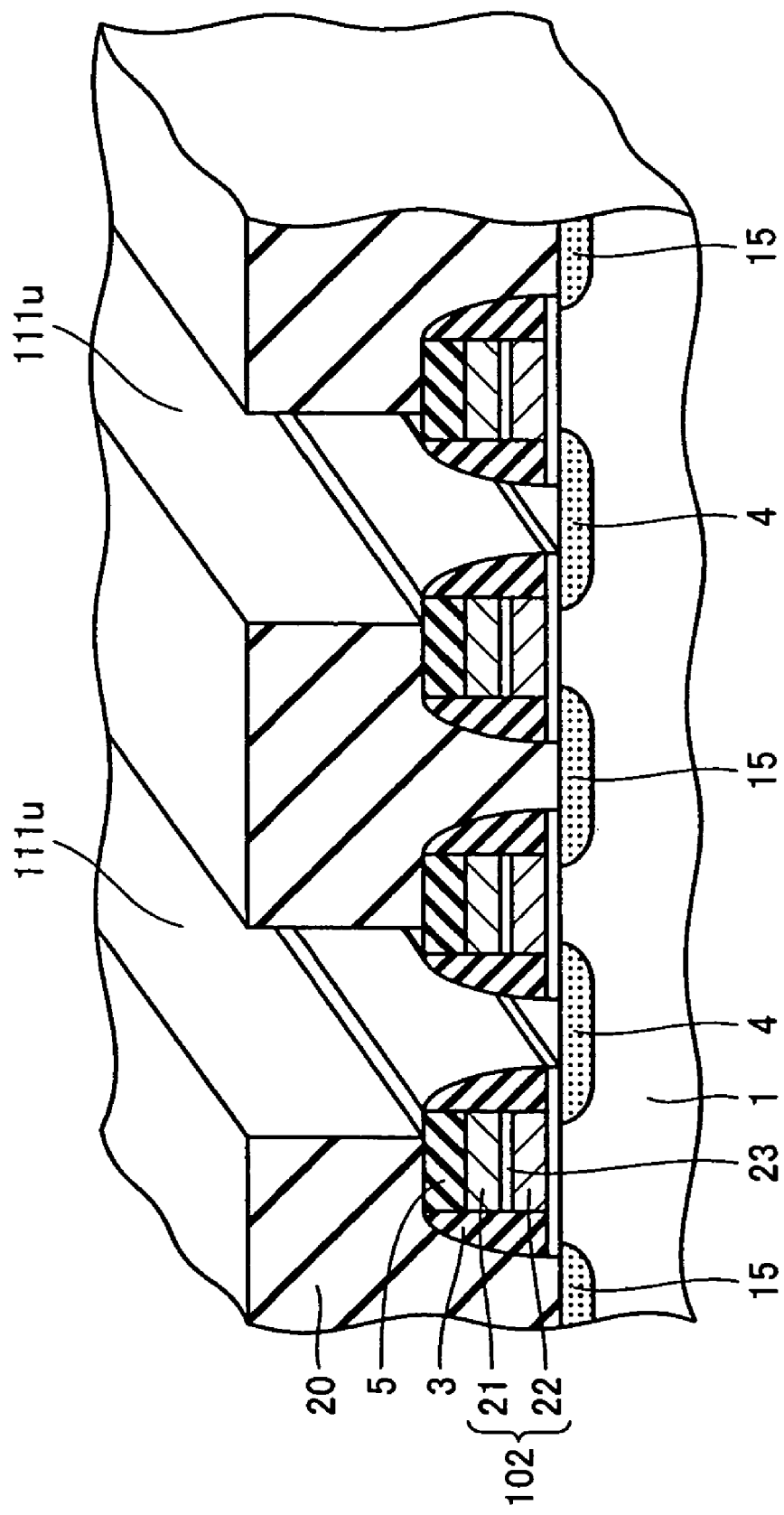
FIG. 9 is a perspective view showing a part of the semiconductor device according to the second embodiment of the present invention which is still in the process of being manufactured.
Figure 10:
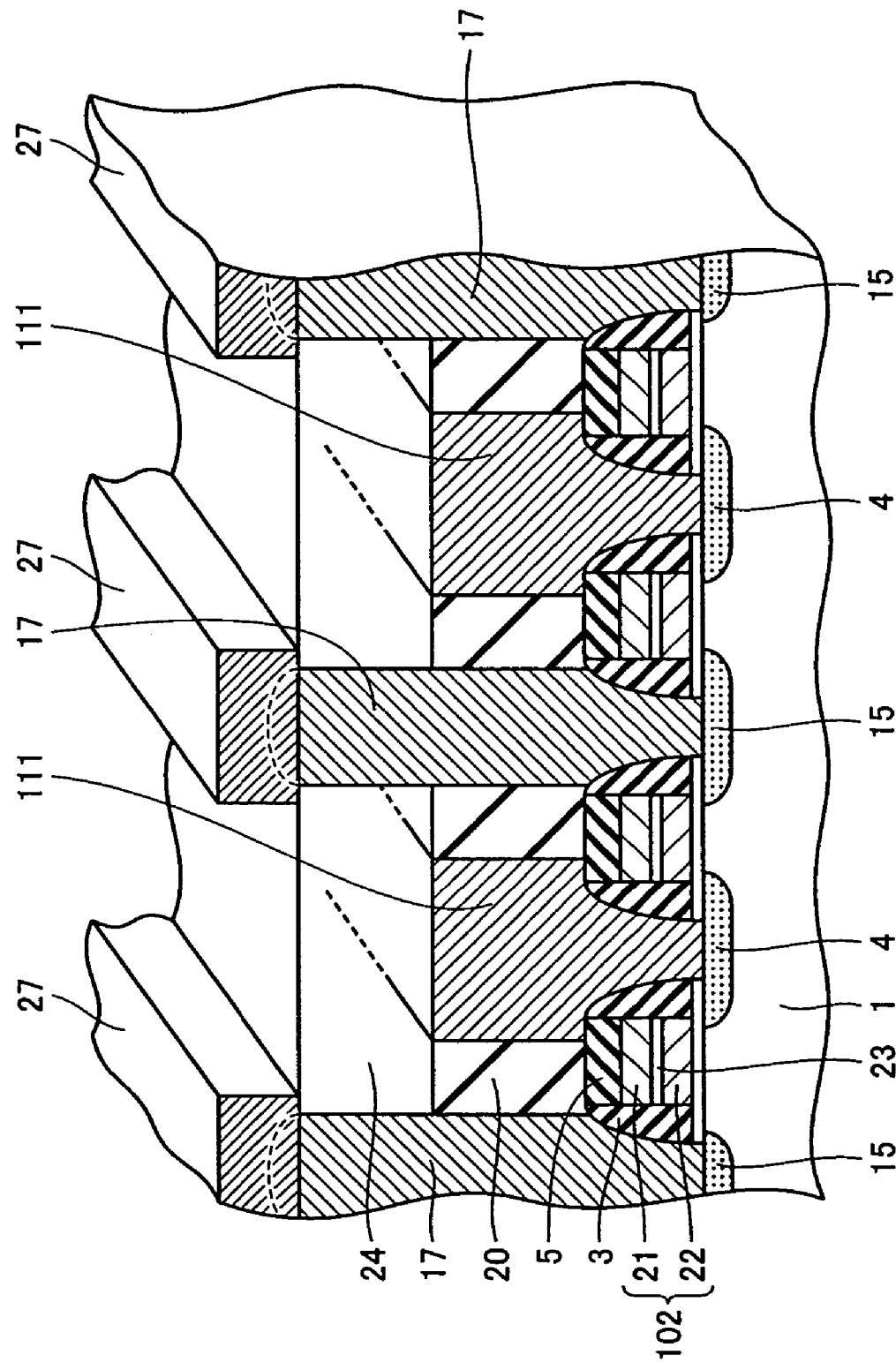
FIG. 10 is a perspective view showing a part of the semiconductor device according to the second embodiment of the present invention.

Referring to FIGS. 9 and 10, a method for manufacturing the semiconductor device according to the second embodiment of the present invention is described. Basically, it is the same as the conventional method for manufacturing a semiconductor device; here, a flash memory structure is illustrated. As shown in FIG. 9, a gate electrode 102 includes a control gate electrode 21 and a floating gate electrode 22. An ONO film 23 is interposed between control gate electrode 21 and floating gate electrode 22. The surface of semiconductor substrate 1 is segmented by a plurality of flash memory structures extending linearly such that an exposed active region provides a source region 4 and drain region 15, alternately. In this case, an interlayer insulating film 20 is formed to cover the whole surface before each elongated region corresponding to source region 4 is etched, and etching is interrupted before sidewall insulating film 3 is removed. In this way, each linear contact hole 111$u$ is formed as shown in FIG. 9. This linear contact hole 111$u$ is filled with a conductive material such as tungsten or polysilicon, thereby forming a linear contact portion 111. Further, as shown in FIG. 10, an interlayer insulating film 24 is formed to cover the entire top surface of linear contact portion 111 and interlayer insulating film 20. In order to form a drain contact 17 of FIG. 10, etching is performed on interlayer insulating film 24 to penetrate it vertically, and the recess made is filled with a conductor. A drain interconnection 27 is formed to be electrically connected with the top end of drain contact 17. Since drain interconnection 27 is formed above the level of interlayer insulating film 24, interconnection can be established with linear contact portion 111 leading to source region 4 being electrically isolated from drain interconnection 27 Or drain contact 17.

It should be noted that drain interconnection 27 is usually referred to as a "bit line". Generally, when an n-type MOS transistor is employed as a memory cell transistor, a bit line is connected to the drain side of the memory cell transistor, while a source line is connected to the source side. The "source side" and "drain side" can be defined as follows: when the memory cell transistor is an n-type MOS transistor, the side towards which a current flows into a memory cell transistor during a read operation is the drain side, while the side from which a current flows out of the memory cell transistor is the source side.

In the semiconductor device according to the present embodiment (see FIG. 8) with the structure described above, the region where sidewall insulating film 3 can easily be removed during etching for forming linear contact hole 111$u$ is contour crossing point 116 of FIG. 8, at which the contour of dummy electrode 118 crosses the circumference of linear contact hole 111$u$, thereby solving the problem of a short circuit caused by undesired removal of sidewall insulating film 3 for gate electrode 102 that is intended to function. Even if a short occurs between one of dummy electrodes 118 and linear contact portion 111 due to undesired removal of sidewall insulating film 3 for dummy electrode 118, it does not present a problem because dummy electrode 118 has nothing to do with the function of the semiconductor device.

In the exemplary structure shown in FIG. 10, drain interconnection 27 defines a first interconnection and is disposed parallel to the straight portion of gate electrodes 102; in this case, it is contemplated that a source interconnection (not shown) is disposed above drain interconnection 27 in the direction perpendicular thereto, i.e. is disposed as a second interconnection perpendicular to the straight portion of gate electrode 102. According to the present embodiment, however, linear contact portion 111 connected to the source region extends significantly, such that the position to be interconnected can be selected arbitrarily, enabling other ways for interconnection than those shown in FIG. 10. For example, the source interconnection can define a first interconnection and be disposed parallel to the straight portion of gate electrodes 102, and the drain interconnection can define a second interconnection and be disposed perpendicularly to the straight portion of gate electrodes 102.

When source regions of respective memory cells adjacent to each other, such as those sharing one control gate electrode, are discrete with isolation insulating films being interposed therebetween, it is still possible to employ a linear contact portion, for example, in a type of flash memory where these source regions are connected to one interconnection, that is, flash memories such as NOR, DINOR, AND and the like, in order to prevent a short circuit between the gate electrode and the contact portion.

Figure 11:
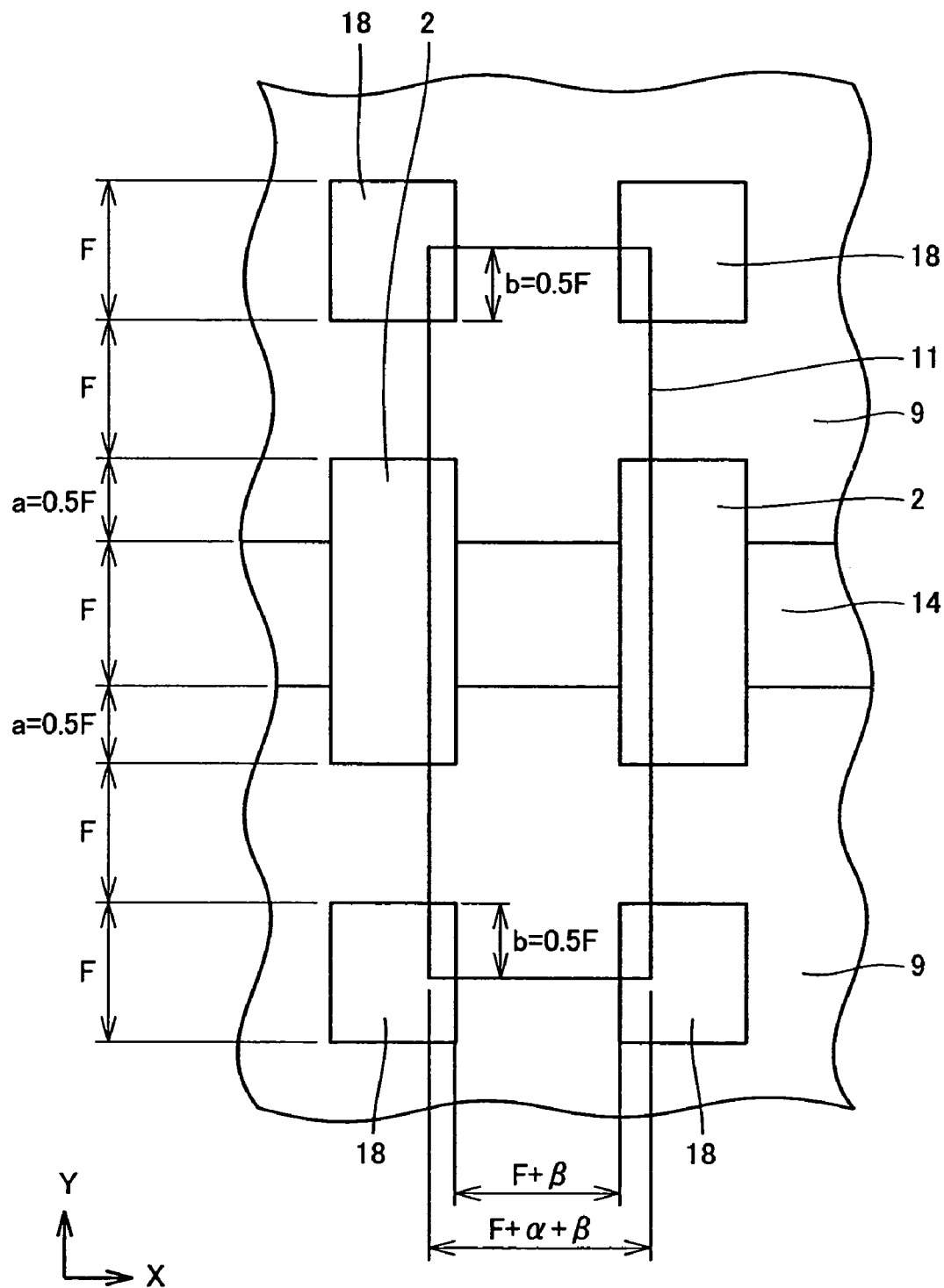
FIG. 11 is a plan view that schematically shows an exemplary arrangement of the linear contact portion and other components of a semiconductor device according to the present invention.

Now, sizes required for arranging a linear contact portion and other components are described. FIG. 11 shows an exemplary arrangement including linear contact portion 11 for one memory cell of a flash memory. The minimum of the size of a linear contact portion was calculated for one memory cell based on the feature size F which can be used as the reference for design size. A "feature size" is the smallest possible space and line width, and is commonly used as principal lengths corresponding to the gate length of a transistor (i.e. width of a gate electrode) or the distance between the gate electrodes.

As shown in FIG. 11, the length of each dummy electrode 18 and the width of active region 14 may be represented by F. The length of the overlap between gate electrode 2 and isolation insulating film 9$a$ should be in the vicinity of 0.5 F, considering deviations in overlap during the photolithographical process and variations in finishing dimension. Similarly, the length of the overlap b between linear contact portion 11 and a dummy electrode 18 in the longitudinal direction of linear contact portion 11 (Y direction) should be about 0.5 F. The extent of the gap between gate electrode 2 and dummy electrode 18 is F, as well, and this gap of F is filled with sidewall insulating film 3 formed from its both sides; that is, the thickness of sidewall insulating film 3 must be F/2 or more for one side of the gap.

Based on the total dimension of the portions described above, the length of the longer side of the rectangle of linear contact portion 11 (Y direction) must be at least 5 F; when using 0.18 µm design rules, it must be 0.90 µm or more.

The example above concerns only one memory cell; since the length of one memory cell in the Y direction is 2 F, the required length of linear contact portion 11 in the longitudinal direction (Y direction) is 3 F+N×2 F, where N is the number of the memory cells disposed along the Y direction.

The length of the shorter side of the rectangle of linear contact portion 11 (X direction) can be expressed as F+$\alpha$+$\beta$, where $\alpha$ is a value determined depending on the overlap between gate electrode 2 and linear contact portion 11 in the X direction. $\beta$ is the width of active region 14 that is required to be unfilled and exposed even after the formation of sidewall insulating film 3 in active region 14 between gate electrodes 2.

In the example shown in FIGS. 5 and 8, the ends of linear contact portions 11, 111 extend past dummy electrodes 18, 118 and protrude from between them, although the present invention is not limited to an application with such a protrusion. One or both ends of the linear contact portion may only extend halfway between the dummy electrodes, as in the example shown in FIG. 11. For example, if some other component is located on the extension of a dummy electrode and the linear contact portion should not protrude from between the dummy electrodes in order to avoid an interference with this component, it is contemplated that an end of the linear contact portion may only extend halfway between the dummy electrodes.

According to the present invention, the source/drain regions do not have to be doped with impurities of high concentration, as opposed to the case where SAS is applied. Thus, the punch-through phenomenon during SAS can be restrained.

It should be noted that SAS can be applied in combination with the present invention if the punch-through phenomenon is not a concern.

Thus, according to the present invention described above, a dummy electrode is provided close to an end of a gate electrode, such that the region where the sidewall insulating film can easily be removed undesirably during etching for forming a linear contact hole is the point at which the contour of the dummy electrode crosses the circumference of the linear contact hole. In this way, the present invention successfully eliminates the problem of a short circuit caused by undesired removal of sidewall insulating film for a gate electrode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate including a source region and drain region at its surface;
   a gate electrode formed so as to include a straight portion separating said source region and said drain region on said semiconductor substrate;
   a dummy electrode formed at a position on an extension of a longitudinal axis of said gate electrode;
   a stopper insulating film, each overlying said gate electrode and said dummy electrode;
   a sidewall insulating film covering a side of said gate electrode, said dummy electrode and said stopper insulating film;
   an interlayer insulating film formed on said semiconductor substrate to cover up said sidewall insulating film and said stopper insulating film; and
   a linear contact portion defined by a conductive member extending vertically in said interlayer insulating film and electrically connected to one of said source region and said drain region at its bottom end, said linear contact portion extending parallel to said straight portion of said gate electrode, said linear contact portion extending to above said dummy electrode;
   wherein a gap between said gate electrode and said dummy electrode is filled with said sidewall insulating film.

2. A semiconductor device comprising:
   a semiconductor substrate including a source region and drain region at its surface;
   a gate electrode formed so as to include a straight portion separating said source region and said drain region on said semiconductor substrate;
   a dummy electrode formed at a position on an extension of a longitudinal direction of said gate electrode;
   a stopper insulating film, each overlying said gate electrode and said dummy electrode;
   a sidewall insulating film covering a side of said gate electrode, said dummy electrode and said stopper insulating film;
   an interlayer insulating film formed on said semiconductor substrate to cover up said sidewall insulating film and said stopper insulating film; and
   a linear contact portion defined by a conductive member extending vertically in said interlayer insulating film and electrically connected to one of said source region and said drain region at its bottom end, said linear contact portion extending parallel to said straight portion of said gate electrode, said linear contact portion extending to above said dummy electrode;
   wherein, in a plan view, each longer side of a rectangle defined by said linear contact portion is located beyond said sidewall insulating film and within a top region of said gate electrode and said dummy electrode, and
   a gap between said gate electrode and said dummy electrode is filled with said sidewall insulating film.

3. A semiconductor device comprising:
   a semiconductor substrate including a source region and drain region at its surface;
   a gate electrode formed so as to include a straight portion separating said source region and said drain region on said semiconductor substrate;
   a dummy electrode formed at a position on an extension of a longitudinal direction of said gate electrode;
   a stopper insulating film, each overlying said gate electrode and said dummy electrode;
   a sidewall insulating film covering a side of said gate electrode, said dummy electrode and said stopper insulating film;
   an interlayer insulating film formed on said semiconductor substrate to cover up said sidewall insulating film and said stopper insulating film; and
   a linear contact portion defined by a conductive member extending vertically in said interlayer insulating film and electrically connected to one of said source region and said drain region at its bottom end, said linear contact portion extending parallel to said straight portion of said gate electrode, said linear contact portion extending to above said dummy electrode;
   wherein said gate electrode is arranged in plurality parallel to each other and one of said source region and said drain region constitutes a group of regions of a specified type defined in regions between adjacent two of said gate electrodes being discrete with an isolation insulating film therebetween, and said linear contact portion extends to integrally cover said group of regions of the specified type.

4. The semiconductor device of claim 3, wherein said one of said source region and said drain region is electrically connected, via said linear contact portion, to a first interconnection extending, above said linear contact portion, parallel to said straight portion, and the other one of said source region and said drain region is electrically connected to a second interconnection extending, above said gate electrode, transversely to said straight portion of said gate electrode.

5. A semiconductor device comprising:
   a semiconductor substrate;
   an isolation insulating film region formed on a surface of said semiconductor substrate and extending in a first direction;
   an active region sectioned by said isolation insulating film and extending in said first direction;
   a gate electrode extending in a second direction traversing said active region;
   a dummy electrode disposed at that end of said gate electrode on an extension of said second direction;
   a first contact portion extending in said second direction along said gate electrode; and
   first and second sidewall insulating films deposited on side surfaces of said gate and dummy electrodes, respectively, wherein;

said first contact portion extends to and above said dummy eletrode; and a gap between said gate and dummy electrodes is filled with said first and second sidewall insulating films continuously.

6. The semiconductor device according to claim 5, further comprsing:

a stopper insulating film overlapping upper sides of said gate and dummy electrodes, respectively; and an interlayer insulating film overlying said semiconductor substrate to cover said stopper and sidewall insulating films.

7. The semiconductor device according to claim 5, more than one said gate electrode being provided in said second direction in parallel, further comprising source and drain regions formed on said active region between said gate electrodes.

8. The semiconductor device according to claim 7, wherein one of a group of said source regions and that of said drain regions has its regions in a region sandwiched between adjacent ones of said gate eletrodes such that said regions are spaced by an isolation insulating film and aligned with each other.

9. The semiconductor device according to claim 5, wherein said first contact portion as seen in said second direction has a side located beyond said first and second sidwall insulating films and within a top region of said gate eletrode.

10. The semiconductor device according to claim 5, wherein said gate electrode includes a floating gate and a control gate electrode disposed on said floating gate electrode with an insulating film posed therebetween.

11. The semiconductor device according to claim 5, wherein said dummy eletrode does not electrically affect the semiconductor device in function.

12. The semiconductor device according to claim5, further comprising:

a second contact portion provided at said interlayer insulating film;

a first interconnection electrically connected to said one said source and drain regions via said second contact portion, and overlying said interlayer insulating film and extending parallel to said seocnd direction; and a second interconnection electrically connected to the other of said source and drain regions via said first contact portion, and overlying said first interconnection and extending in said first direction.

* * * * *